（12） United States Patent
Mori et al.

(10) Patent No.: US 11,927,882 B2
(45) Date of Patent: Mar. 12, 2024

(54) QUARTZ GLASS PLATE

(71) Applicant: SHIN-ETSU QUARTZ PRODUCTS CO., LTD., Tokyo (JP)

(72) Inventors: Tatsuya Mori, Koriyama (JP); Akira Sato, Koriyama (JP); Atsushi Shimada, Sasebo (JP); Yuya Yokosawa, Koriyama (JP); Nobumasa Yoshida, Koriyama (JP)

(73) Assignee: SHIN-ETSU QUARTZ PRODUCTS CO., LTD., Tokyo (JP)

( * ) Notice: Subject to any disclaimer, the term of this patent is extended or adjusted under 35 U.S.C. 154(b) by 765 days.

(21) Appl. No.: 17/046,202

(22) PCT Filed: Mar. 25, 2019

(86) PCT No.: PCT/JP2019/012454
§ 371 (c)(1),
(2) Date: Oct. 8, 2020

(87) PCT Pub. No.: WO2019/202921
PCT Pub. Date: Oct. 24, 2019

(65) Prior Publication Data
US 2021/0173299 A1    Jun. 10, 2021

(30) Foreign Application Priority Data

Apr. 18, 2018    (JP) .................. 2018-080176

(51) Int. Cl.
*G03F 1/64*    (2012.01)
*C03B 20/00*    (2006.01)
(Continued)

(52) U.S. Cl.
CPC ............... *G03F 1/64* (2013.01); *C03B 20/00* (2013.01); *C03C 3/06* (2013.01); *C03C 4/0085* (2013.01);
(Continued)

(58) Field of Classification Search
None
See application file for complete search history.

(56) References Cited

U.S. PATENT DOCUMENTS 5,316,564 A * 5/1994 Nakamura ............. C03B 19/09
359/848
2002/0007907 A1    1/2002 Arishima et al.
(Continued)

FOREIGN PATENT DOCUMENTS

CN    1610651 A    4/2005
CN    101052599 A    10/2007
(Continued)

OTHER PUBLICATIONS

Oct. 29, 2020 English Translation of International Preliminary Report on Patentability in application No. PCT/JP2019/012454.
(Continued)

*Primary Examiner* — Jeffrey D Washville
(74) *Attorney, Agent, or Firm* — Oliff PLC

(57) ABSTRACT

A quartz glass plate has a quartz glass plate body and a quartz glass member adhered to the quartz glass plate body through an adhesive layer, where the adhesive layer contains silica, and a sum of concentrations of Li, Na, and K ions, being alkali metal ions and Ca ions, being alkaline earth metal ions contained in the adhesive layer is 10 ppm by mass or less. Consequently, a step with a uniform thickness can be formed, and a quartz glass plate is not easily damaged by irradiation with a light containing an ultraviolet ray.

11 Claims, 1 Drawing Sheet

(51) Int. Cl.
    *C03C 3/06*         (2006.01)
    *C03C 4/00*         (2006.01)
    *C03C 8/24*         (2006.01)
    *C03C 27/10*       (2006.01)

(52) U.S. Cl.
    CPC ............... *C03C 8/24* (2013.01); *C03C 27/10* (2013.01); *C03C 2201/02* (2013.01)

(56) References Cited

U.S. PATENT DOCUMENTS

| | | | |
|---|---|---|---|
| 2002/0038557 A1* | 4/2002 | Matsuo | C03C 3/06 65/17.6 |
| 2005/0106396 A1 | 5/2005 | Onuki | |
| 2006/0046075 A1 | 3/2006 | Maul et al. | |
| 2008/0286952 A1 | 11/2008 | Miyairi et al. | |
| 2009/0151848 A1* | 6/2009 | Werdecker | C03C 27/06 156/62.2 |
| 2012/0325315 A1 | 12/2012 | Shinohara | |
| 2016/0018736 A1 | 1/2016 | Hirose et al. | |

FOREIGN PATENT DOCUMENTS

| | | |
|---|---|---|
| CN | 101308782 A | 11/2008 |
| CN | 102782871 A | 11/2012 |
| CN | 104685627 A | 6/2015 |
| EP | 1460047 A1 | 9/2004 |
| JP | H10-282339 A | 10/1998 |
| JP | 2002-055439 A | 2/2002 |
| JP | 2002-060227 A | 2/2002 |
| JP | 2003-201153 A | 7/2003 |
| JP | 2004-004998 A | 1/2004 |
| JP | 2005-070191 A | 3/2005 |
| JP | 2005-330113 A | 12/2005 |
| JP | 2008-511527 A | 4/2008 |
| JP | 2009-143797 A | 7/2009 |
| JP | 2012-144398 A | 8/2012 |
| JP | 2014-209548 A | 11/2014 |

OTHER PUBLICATIONS

Sep. 30, 2022 Office Action issued in Taiwanese Patent Application No. 108111599.
Jun. 11, 2019 International Search Report issued in International Patent Application No. PCT/JP2019/012454.
Excelica High-purity synthetic spherical silica, Tokuyama Corporation, 2011.
Nov. 30, 2021 Extended European Search Report issued in European Patent Application No. 19787576.8.
Jan. 18, 2022 Office Action issued in Japanese Patent Application No. 2018-080176.
Sep. 14, 2023 Office Action issued in Korean Patent Application No. 10-2020-7029855.
Mar. 28, 2022 Office Action and Search Report issued in Chinese Patent Application No. 201980026148.3.

* cited by examiner

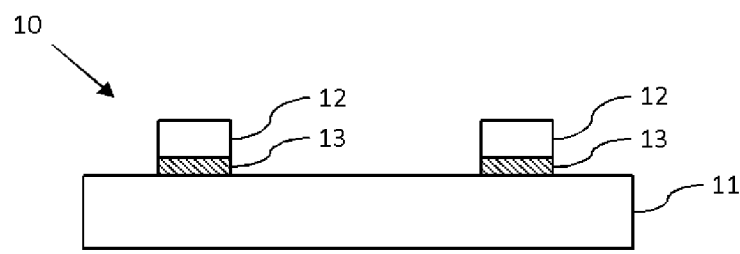

QUARTZ GLASS PLATE

TECHNICAL FIELD

The present invention relates to a quartz glass plate.

BACKGROUND ART

In a photolithography step of a semiconductor process, patterning is performed by exposure of a silicon wafer coated with a photoresist. If a mask used on this occasion has a scratch, etc., a defect occurs in the pattern at the time of exposure, and therefore, a pellicle is commonly attached to the mask in order to prevent this. In a pellicle, a pellicle plate is used in the form of being fixed to a frame with an adhesive. In recent years, miniaturization in photolithography has progressed, and an ultraviolet ray having a shorter wavelength and greater energy has come to be used, and regarding frame and adhesives, materials having high heat resistance and ultraviolet ray resistance are becoming necessary. Furthermore, when exposure is performed with a pellicle attached to a mask, the pattern slips out of position if the optical path length of the light for the exposure changes, and therefore, a strict surface accuracy is required for the frame adhered to the pellicle plate as well. For example, Patent Document 1 reports a method of using a quartz glass having high heat resistance and ultraviolet ray resistance as a pellicle plate and frame. However, when the pellicle plate and the frame are adhered, an ultraviolet curable resin is used as an adhesive, and therefore, adhesive strength is degraded by an ultraviolet ray with a short wavelength, causing peeling and the like. Furthermore, when irradiated with an ultraviolet ray having a greater energy, the ultraviolet curable resin undergoes thermal expansion and peeling and deformation occur, and therefore, precision of the frame is also degraded. A method by which a frame can be adhered precisely with resistance to ultraviolet rays is desired.

An ultraviolet ray irradiation apparatus for plate cleaning using a deep ultraviolet ray light source is being developed. In recent years, miniaturization of package substrates, flat panels, and semiconductor chips, etc. has progressed, and development of an apparatus for high-output ultraviolet ray irradiation that has a detergency capable of cleaning fine parts is being progressed. To increase the number to treat per batch from a viewpoint of cost reduction, increase in the size of plates has also progressed, and accordingly, apparatuses for ultraviolet ray irradiation have also increased in size.

In an apparatus for ultraviolet ray irradiation, a quartz glass that can transmit a deep ultraviolet ray is used as a window plate. As an ultraviolet ray irradiation apparatus that has a high cleaning capability and is compatible with large plates come to be required, a quartz glass plate used for such an apparatus is also required to have complicated shapes, for example, large and partially having steps, etc. For example, Patent Document 2 suggests a technology related to an ultraviolet ray treatment apparatus for the purpose of resist removal in a production process of a semiconductor or a liquid crystal, etc. or removal of an organic resin remaining after drilling a printed circuit board. A large quartz glass plate having steps is used in this apparatus, and the steps are formed by HF etching, sandblasting, grinding, etc. However, it is difficult to control the height of the steps in this method, and variation occurs in the gap between the object to be treated and the ultraviolet ray light source at the time of treatment with an ultraviolet ray, making it difficult to perform the treatment uniformly. A method by which steps can be formed precisely with resistance to ultraviolet rays is required.

CITATION LIST

Patent Literature

Patent Document 1: Japanese Unexamined Patent Application Publication No. 2005-70191
Patent Document 2: Japanese Unexamined Patent Application Publication No. 2014-209548

SUMMARY OF INVENTION

Technical Problem

The present invention has been made in view of the above-described circumstances, and an object thereof is to provide a quartz glass plate that can form steps having a uniform thickness and is not easily damaged by irradiation with an ultraviolet ray or a light containing an ultraviolet ray.

Solution to Problem

The present invention has been made to solve the above problems and provides a quartz glass plate having
a quartz glass plate body and
a quartz glass member adhered to the quartz glass plate body through an adhesive layer, wherein
the adhesive layer comprises silica, and
a sum of concentrations of Li, Na, and K ions, being alkali metal ions and Ca ions, being alkaline earth metal ions contained in the adhesive layer is 10 ppm by mass or less.

In the inventive quartz glass plate, a step having a uniform thickness can be formed by having an adhesive layer and a quartz glass member. At the same time, fracture due to irradiation with a light containing an ultraviolet ray does not easily occur when the sum of the concentrations of alkali metal ions (Li, Na, and K ions) and alkaline earth metal ions (Ca ions) contained in the adhesive layer is 10 ppm by mass or less.

In this event, the quartz glass plate body adhered to the quartz glass member through the adhesive layer preferably has a birefringence of 100 nm/cm or less when irradiated with an ultraviolet ray at a total irradiation energy within a range of more than 0 $kJ/cm^2$ and 20000 $kJ/cm^2$ or less.

When the quartz glass plate body that constitutes the quartz glass plate has such a birefringence, the object to be irradiated can be irradiated with an ultraviolet ray sufficiently uniformly.

Furthermore, the adhesive layer preferably has a density of 1.0 $g/cm^3$ or more and 2.0 $g/cm^3$ or less.

When the adhesive layer has a density of such a range, stress can be relaxed and fracture due to distortion does not easily occur.

Furthermore, the adhesive layer preferably has a thickness of 100 μm or less. In addition, the adhesive layer preferably has an adhesive strength of 10 $kgf/cm^2$ or more when irradiated with an ultraviolet ray at a total irradiation energy within a range of more than 0 $kJ/cm^2$ and 20000 $kJ/cm^2$ or less.

When the adhesive layer has a thickness of 100 μm or less as described, adhesive strength becomes higher. Furthermore, when the adhesive layer has an adhesive strength of 10 $kgf/cm^2$ or more, the adhesive layer is not easily fractured due to distortion of the quartz glass plate or heat.

Furthermore, the quartz glass plate can be for an ultraviolet ray irradiation window.

A quartz glass plate having such a structure can be applied to the above-mentioned articles, and in particular, specifically, can be used suitably for use in an ultraviolet ray irradiation window.

Advantageous Effects of Invention

The present invention makes it possible to form a step with a uniform thickness, and to provide a quartz glass plate that is not easily damaged by irradiation with a light containing an ultraviolet ray. In particular, in the inventive quartz glass plate, a step formed by a quartz glass member is uniform, and uniform irradiation with an ultraviolet ray is possible. Furthermore, it is possible to achieve a quartz glass plate that is not degraded or damaged by heat or an ultraviolet ray.

BRIEF DESCRIPTION OF DRAWING

FIG. 1 is a schematic cross-sectional view showing an example of a quartz glass plate according to the present invention.

DESCRIPTION OF EMBODIMENTS

Hereinafter, the present invention will be more specifically described with reference to the drawing. An example of a quartz glass plate 10 according to the present invention has been shown in FIG. 1. The quartz glass plate 10 has a quartz glass plate body 11 and a quartz glass member 12 adhered to the quartz glass plate body 11 through an adhesive layer 13. Furthermore, the adhesive layer 13 contains silica. In addition, the sum of the concentrations of Li, Na, and K ions, being alkali metal ions and Ca ions, being alkaline earth metal ions contained in the adhesive layer 13 is 10 ppm by mass or less.

The inventive quartz glass plate 10 having such an adhesive layer 13 can be used suitably for use in an ultraviolet ray irradiation window. In addition, the inventive quartz glass plate 10 can be used suitably for uses that involve being irradiated with an ultraviolet ray.

However, the inventive quartz glass plate 10 is not limited to use for an ultraviolet ray irradiation window, etc., and can be applied to various uses. Furthermore, FIG. 1 shows an example where a quartz glass member 12 is adhered to the quartz glass plate body 11 by the adhesive layer 13 in two places, but this is not limiting, and the number of quartz glass members 12 adhered to the quartz glass plate body 11 is not particularly limited. Furthermore, the shape of the quartz glass member 12 can be variously designed according to use. For example, the quartz glass member 12 can be in rod shapes having various lengths, or can also be an annular or quadrilateral frame-shaped member. Hereinafter, the inventive quartz glass plate 10 will be described focusing on use for an ultraviolet ray irradiation window.

In the quartz glass plate 10 shown in FIG. 1, the quartz glass plate body 11 has quartz glass members 12 through adhesive layers 13. In this manner, the quartz glass members 12 can be given a function as steps. In use for an ultraviolet ray irradiation window, the quartz glass plate 10 can provide a uniform space between an object to be irradiated by adjusting the height of such steps. Since the quartz glass members 12 are joined to the quartz glass plate body 11 through the adhesive layers 13, it is possible to produce an apparatus that can irradiate an object to be irradiated precisely and uniformly with an ultraviolet ray by joining the quartz glass members 12 to a quartz glass plate body 11 polished with high precision, for example. In this case, the quartz glass plate body 11 and the quartz glass members 12 are all dense bodies.

As the quartz glass plate body 11 used in the present invention, a synthetic quartz glass obtained by a known method of flame-hydrolyzing silicon tetrachloride can be used suitably. Such a quartz glass plate body 11 has little fall in transmittance at the time of irradiation with an ultraviolet ray. The quartz glass members 12 can also be obtained by flame hydrolysis of silicon tetrachloride. However, the quartz glass plate body 11 and the quartz glass members 12 can be produced by other production methods.

In the inventive quartz glass plate 10, the sum of the concentrations of alkali metal ions and alkaline earth metal ions contained in the adhesive layers 13 is 10 ppm by mass or less, as described above. Here, the alkali metal ions are Li, Na, and K ions, and the alkaline earth metal ions are Ca ions. If the sum of the concentrations of these ions exceeds 10 ppm by mass, ultraviolet ray absorption in the adhesive layers 13 is increased and causes heat, and the adhesive layers 13 are easily fractured due to thermal expansion.

Furthermore, in the inventive quartz glass plate 10, the quartz glass plate body 11 preferably has a birefringence of 100 nm/cm or less when irradiated with an ultraviolet ray at a total irradiation energy within a range of more than 0 kJ/cm$^2$ and 20000 kJ/cm$^2$ or less. Here, the ultraviolet ray may have a wavelength within the range of 150 nm or more and 300 nm or less. Furthermore, the birefringence of the quartz glass plate body 11 is a value measured after irradiating with an ultraviolet ray in a state of being adhered to the quartz glass members 12 through the adhesive layers 13. Furthermore, the above conditions of the birefringence are preferably satisfied in any arbitrary point on the quartz glass plate body 11 that can be measured by a birefringence measurement equipment, but in particular, the birefringence becomes large in the vicinity of the portion where the quartz glass members 12 are adhered through the adhesive layers 13. When the birefringence of the quartz glass plate body 11 is smaller than 100 nm, the difference in birefringence between the vicinity of this portion and a portion at a distance therefrom becomes small, and internal stress due to distortion is not easily increased, and thus, the quartz glass plate body 11 becomes difficult to damage. Furthermore, under the above conditions, refraction of an ultraviolet ray due to internal distortion of the quartz glass plate body becomes small, and the difference in the intensity distribution of the ultraviolet ray becomes small, and therefore, the object to be irradiated can be uniformly irradiated with the ultraviolet ray.

As described above, the adhesive layers 13 contain silica. These adhesive layers 13 are preferably constituted from spherical silica particles. That is, the adhesive layers 13 preferably have spherical silica particles fused with each other, and have minute spaces in portions other than the fused portions.

Since the adhesive layers 13 are substantially constituted from only silica, the bonding energy of Si—O—Si is great, and the adhesive layers 13 are not degraded, colored, or damaged even when irradiated with an ultraviolet ray having great energy. Moreover, the adhesive layers 13 do not become damaged due to thermal expansion since thermal expansion coefficient of silica is small even when the adhesive layers 13 have a high temperature.

The adhesive layers 13 preferably have a density of 1.0 g/cm$^3$ or more and 2.0 g/cm$^3$ or less. When the vicinity of the adhesive layers 13 is irradiated with an ultraviolet ray, stress is exerted due to distortion, but when the density of the adhesive layers 13 is within the above range, the stress is relaxed, and strength can be maintained. When the adhesive layers 13 have a density of 1.0 g/cm$^3$ or more, the adhesive layers 13 become stronger and difficult to fracture. When the adhesive layers 13 have a density of 2.0 g/cm$^3$ or less, stress is relaxed, and fracture due to distortion does not easily occur. The density of the adhesive layers 13 can be adjusted by the particle size or particle size distribution of the above-described spherical silica particles, for example.

The adhesive layers 13 preferably have a thickness of 100 μm or less. When the adhesive layers 13 have a thickness of 100 μm or less, adhesive strength becomes higher and the adhesive layers 13 are not easily fractured due to distortion or heat caused by an ultraviolet ray. Furthermore, when irradiated with an ultraviolet ray at a total irradiation energy within a range of more than 0 kJ/cm$^2$ and 20000 kJ/cm$^2$ or less, the adhesive layer 13 preferably has an adhesive strength or 10 kgf/cm$^2$ or more. When the adhesive strength is 10 kgf/cm$^2$ (approximately 98.1 N/cm$^2$) or more, fracture of the adhesive layers 13 due to distortion caused by an ultraviolet ray or fracture of the adhesive layers 13 due to heat do not easily occur.

A quartz glass plate 10 having an adhesive layer 13 can be fabricated as follows. However, the method is not limited to this method, and the quartz glass plate 10 can be produced by various methods.

Firstly, as a raw material for fabricating the adhesive layer 13, a solution of hydrolyzed alkoxysilane is prepared. As the alkoxysilane to hydrolyze, tetraethoxysilane can be suitably used. In addition, silica particles are prepared as a raw material. Since the sum of the concentrations of alkali metal ions and alkaline earth metal ions needs to be 10 ppm by mass or less in the adhesive layer 13 to be fabricated in the present invention as described above, it is necessary to use, as the raw material, silica particles that contain almost no Li, Na, K, and Ca. Note that when a hydrolyzed solution of alkoxysilane is used as described above, minute amounts of alkali metal ions and alkaline earth metal ions contained in the solution also need to be taken into consideration, and the solution needs to be of high purity. Moreover, alkali metal ions and alkaline earth metal ions that become incorporated from outside in the process also need to be considered.

Silica slurry is obtained by introducing the silica particles into the hydrolyzed solution of alkoxysilane prepared as described above and stirring. This silica slurry is applied to a quartz glass plate body 11. A quartz glass member 12 is placed on the silica slurry applied to the quartz glass plate body 11. Next, as necessary, a load is applied to the quartz glass member 12 and the quartz glass member 12 is left standing for a predetermined time. The thickness and adhesive strength of the adhesive layer 13 can be adjusted by the applied amount of silica slurry and the amount of the load. Subsequently, the silica slurry that protrude to parts where the silica slurry is not necessary is removed. This is then dried at room temperature. In addition, sintering is performed as necessary. The sintering temperature can be set appropriately, but can be for example, 300° C. or more and 1200° C. or less. The silica slurry can be made into the adhesive layer 13 by this drying (and/or sintering).

In the manner described above, the quartz glass plate 10 shown in FIG. 1 having a quartz glass plate body 11 and a quartz glass member 12 adhered to the quartz glass plate body 11 through an adhesive layer 13 can be produced. Note that after forming the adhesive layer 13, the quartz glass member 12 can be ground as necessary.

Example

Hereinafter, the present invention will be described more specifically with reference to Examples of the present invention and Comparative Examples, but the present invention is not limited to these Examples.

Example 1-1

A quartz glass plate 10 shown in FIG. 1 was produced as a quartz glass plate for an ultraviolet ray irradiation window through the following process.

Firstly, 10 g of silica particles (average particle size: 1.5 μm, total concentration of Li, Na, K, and Ca: 4 ppm by mass) was introduced into 1.5 g of a solution of hydrolyzed tetraethoxysilane. The resultant was then stirred for 1 minute using a stirrer to obtain silica slurry.

Next, the silica slurry was applied to a polished quartz glass plate body 11 (synthetic quartz glass plate) of 300 mm×300 mm×5 mm thickness. Next, quartz glass members 12 (quartz glass band plates) of 5 mm square×200 mm were placed on the quartz glass plate body 11, a load of 2 gf/mm$^2$ (approximately 0.2 N/mm$^2$) was applied and this was left standing as it was for 1 hour. Note that two quartz glass members 12 (quartz glass band plates) were used and were adhered to two parts of the quartz glass plate body 11. Subsequently, the silica slurry that stuck out was taken off, and the resultant was sintered under the conditions of 1000° C. and 10 hours to obtain a quartz glass plate with steps. Next, the steps of this quartz glass plate with steps were ground so that the height from the synthetic quartz glass plate (quartz glass plate body 11) was 0.5 mm. In this manner, a quartz glass plate (quartz glass plate 10 in FIG. 1) for an ultraviolet ray irradiation window was obtained.

The quartz glass plate 10 (quartz glass plate for an ultraviolet ray irradiation window) was irradiated with an excimer lamp light with a wavelength of 172 nm so that the total irradiation energy was 1000 kJ/cm$^2$.

Example 1-2

A quartz glass plate 10 (quartz glass plate for an ultraviolet ray irradiation window) was obtained basically in the same manner as in Example 1-1, but with a change from Example 1-1 that silica particles having a total concentration of Li, Na, K, and Ca of 6 ppm by mass was used as raw material silica particles. The quartz glass plate 10 (quartz glass plate for an ultraviolet ray irradiation window) produced in this manner was irradiated with an excimer lamp light with a wavelength of 172 nm so that the total irradiation energy was 1000 kJ/cm$^2$.

Example 1-3

A quartz glass plate 10 (quartz glass plate for an ultraviolet ray irradiation window) was obtained basically in the same manner as in Example 1-1, but with a change from Example 1-1 that silica particles having a total concentration of Li, Na, K, and Ca of 8 ppm by mass was used as raw material silica particles. The quartz glass plate 10 (quartz glass plate for an ultraviolet ray irradiation window) produced in this manner was irradiated with an excimer lamp light with a wavelength of 172 nm so that the total irradiation energy was 1000 kJ/cm$^2$.

Comparative Example 1-1

A quartz glass plate (quartz glass plate for an ultraviolet ray irradiation window) was obtained basically in the same manner as in Example 1-1, but with a change from Example 1-1 that silica particles having a total concentration of Li, Na, K, and Ca of 10 ppm by mass was used as raw material silica particles. The quartz glass plate (quartz glass plate for an ultraviolet ray irradiation window) produced in this manner was irradiated with an excimer lamp light with a wavelength of 172 nm so that the total irradiation energy was 1000 kJ/cm².

Comparative Example 1-2

A quartz glass plate (quartz glass plate for an ultraviolet ray irradiation window) was obtained basically in the same manner as in Example 1-1, but with a change from Example 1-1 that particles obtained by pulverizing natural quartz was used as raw material silica particles. The quartz glass plate (quartz glass plate for an ultraviolet ray irradiation window) produced in this manner was irradiated with an excimer lamp light with a wavelength of 172 nm so that the total irradiation energy was 1000 kJ/cm².

Example 2-1

A quartz glass plate 10 (quartz glass plate for an ultraviolet ray irradiation window) was obtained in the same manner as in Example 1-1. This quartz glass plate 10 was irradiated with an excimer lamp light with a wavelength of 172 nm so that the total irradiation energy was 5000 kJ/cm².

Example 2-2

A quartz glass plate 10 (quartz glass plate for an ultraviolet ray irradiation window) was obtained in the same manner as in Example 1-1. This quartz glass plate 10 was irradiated with an excimer lamp light with a wavelength of 172 nm so that the total irradiation energy was 10000 kJ/cm².

Example 2-3

A quartz glass plate 10 (quartz glass plate for an ultraviolet ray irradiation window) was obtained in the same manner as in Example 1-1. This quartz glass plate 10 was irradiated with an excimer lamp light with a wavelength of 172 nm so that the total irradiation energy was 15000 kJ/cm².

Example 2-4

A quartz glass plate 10 (quartz glass plate for an ultraviolet ray irradiation window) was obtained in the same manner as in Example 1-1. This quartz glass plate 10 was irradiated with an excimer lamp light with a wavelength of 172 nm so that the total irradiation energy was 20000 kJ/cm².

Example 2-5

A quartz glass plate 10 (quartz glass plate for an ultraviolet ray irradiation window) was obtained in the same manner as in Example 1-1. This quartz glass plate 10 was irradiated with an excimer lamp light with a wavelength of 172 nm so that the total irradiation energy was 25000 kJ/cm².

Example 2-6

A quartz glass plate 10 (quartz glass plate for an ultraviolet ray irradiation window) was obtained in the same manner as in Example 1-1. This quartz glass plate 10 was irradiated with an ultraviolet light with a wavelength of 254 nm so that the total irradiation energy was 1000 kJ/cm².

Comparative Example 2-1

A quartz glass plate 10 (quartz glass plate for an ultraviolet ray irradiation window) was obtained basically in the same manner as in Example 1-1, but with a change from Example 1-1 that silica particles having a total concentration of Li, Na, K, and Ca of 10 ppm by mass was used as raw material silica particles. The quartz glass plate 10 produced in this manner was irradiated with an excimer lamp light with a wavelength of 172 nm so that the total irradiation energy was 5000 kJ/cm².

Comparative Example 2-2

A quartz glass plate 10 (quartz glass plate for an ultraviolet ray irradiation window) was obtained in the same manner as in Comparative Example 2-1. This quartz glass plate 10 was irradiated with an excimer lamp light with a wavelength of 172 nm so that the total irradiation energy was 10000 kJ/cm².

Comparative Example 2-3

A quartz glass plate 10 (quartz glass plate for an ultraviolet ray irradiation window) was obtained in the same manner as in Comparative Example 2-1. This quartz glass plate 10 was irradiated with an excimer lamp light with a wavelength of 172 nm so that the total irradiation energy was 20000 kJ/cm².

Comparative Example 2-4

A quartz glass plate 10 (quartz glass plate for an ultraviolet ray irradiation window) was obtained basically in the same manner as in Example 1-1, but with a change from Example 1-1 that a commercially available ceramics adhesive was used instead of silica slurry. The quartz glass plate 10 produced in this manner was irradiated with an excimer lamp light with a wavelength of 172 nm so that the total irradiation energy was 20000 kJ/cm².

Example 3-1

A quartz glass plate 10 (quartz glass plate for an ultraviolet ray irradiation window) was obtained basically in the same manner as in Example 1-1, but with a change from Example 1-1 that 5 g of silica particles were introduced as a raw material. The quartz glass plate 10 produced in this manner was irradiated with an excimer lamp light with a wavelength of 172 nm so that the total irradiation energy was 1000 kJ/cm².

Example 3-2

A quartz glass plate 10 (quartz glass plate for an ultraviolet ray irradiation window) was obtained basically in the same manner as in Example 1-1, but with a change from Example 1-1 that 3 g of silica particles were introduced as a raw material. The quartz glass plate 10 produced in this manner was irradiated with an excimer lamp light with a wavelength of 172 nm so that the total irradiation energy was 1000 kJ/cm².

Example 4-1

A quartz glass plate 10 (quartz glass plate for an ultraviolet ray irradiation window) was obtained basically in the same manner as in Example 1-1, but with the load applied to the quartz glass members 12 (quartz glass band plates) changed from Example 1-1 to 1 gf/mm² (approximately 0.1 N/mm²). The quartz glass plate 10 produced in this manner was irradiated with an excimer lamp light with a wavelength of 172 nm so that the total irradiation energy was 1000 kJ/cm².

Example 4-2

A quartz glass plate 10 (quartz glass plate for an ultraviolet ray irradiation window) was obtained basically in the same manner as in Example 1-1, but with the load applied to the quartz glass members 12 (quartz glass band plates) changed from Example 1-1 to 0.5 gf/mm² (approximately 0.05 N/mm²). The quartz glass plate 10 produced in this manner was irradiated with an excimer lamp light with a wavelength of 172 nm so that the total irradiation energy was 1000 kJ/cm².

Comparative Example 3-1

A polished synthetic quartz glass plate of 300 mm×300 mm×6 mm thickness was ground so as to have steps (the steps were in two places) with a height of 0.5 mm and a length of 200 mm. Except for the steps, the synthetic quartz glass plate was ground and polished to a thickness of 5 mm. A quartz glass plate for an ultraviolet ray irradiation window was obtained in this manner. This quartz glass plate for an ultraviolet ray irradiation window was irradiated with an excimer lamp light with a wavelength of 172 nm so that the total irradiation energy was 1000 kJ/cm².

Comparative Example 3-2

A polished synthetic quartz glass plate of 300 mm×300 mm×5 mm thickness was coated with an acrylate ultraviolet curable resin, a quartz glass band plate of 5 mm square×200 mm was placed thereon (in two places), and this was left standing as it was for 1 hour. Subsequently, the ultraviolet curable resin that stuck out was taken off, and irradiation with an ultraviolet ray having a wavelength of 365 nm was performed for 30 seconds to obtain a quartz glass plate with steps. The steps of the quartz glass plate with steps were ground so that the height from the synthetic quartz glass plate was 0.5 mm to obtain a quartz glass plate for an ultraviolet ray irradiation window. This quartz glass plate for an ultraviolet ray irradiation window was irradiated with an excimer lamp light with a wavelength of 172 nm so that the total irradiation energy was 1000 kJ/cm².

[Measuring Method]

The sum of the concentrations of alkali metal ions and alkaline earth metal ions in the adhesive layer The adhesive layer in each Example and Comparative Example was taken out and measured by ICP-AES (inductively coupled plasma atomic emission spectroscopy).

Birefringence

Regarding birefringence, birefringence was measured using a birefringence measurement equipment EXICOR350AT (manufactured by Hinds Instruments) at a wavelength of 632.8 nm. Birefringence of the quartz glass plate body (in Comparative Example 3-1, in portions other than those with steps formed by grinding) was measured in multiple arbitrary points where it was possible to measure with the measurement equipment, and the maximum birefringence among these was taken as the maximum birefringence.

Density of the Adhesive Layer

The density of the adhesive layer was calculated from the volume and the mass (weight) of the adhesive layer.

Thickness of the Adhesive Layer

The thicknesses of the quartz glass members and the quartz glass plate body were measured with a micrometer before the quartz glass members were adhered, and the total thickness of the step and the quartz glass plate body including the adhesive layer was measured with the micrometer after adhering. The former value was subtracted to measure the thickness of the adhesive layer.

Adhesive Strength

Samples for measuring adhesive strength as described below were fabricated. Two pieces of quartz glass of 10 mm square×20 mm were adhered under the same conditions as each Example and Comparative Example and after irradiation with an excimer lamp light with a wavelength of 172 nm (ultraviolet light with a wavelength of 254 nm in Example 2-6), the samples for measuring adhesive strength were fractured in a three-point bending test so that the indenters were on the adhesive layer, and the maximum strength just before the fracture was taken as the adhesive strength.

The results of the Examples and Comparative Examples are shown in the following Table 1 and Table 2. "Partly damaged" and "Partly delaminated" in the Table indicate that the damage or delamination or the quartz glass members 12 was partial and there were no practical problems. Furthermore, "Damaged only in a small part" indicates that the degree of the damage was particularly small.

TABLE 1

|  | Total concentration of alkali metal ions and alkaline earth metal ions in adhesive layer (ppm) | Maximum birefringence (nm/cm) | Density of adhesive layer (g/cm³) | Thickness of adhesive layer (μm) | Adhesive strength (kgf/cm²) | Height of steps (mm) |
|---|---|---|---|---|---|---|
| Example 1-1 | 5.3 | 43 | 1.53 | 61 | 23 | 0.49 to 0.51 |
| Example 1-2 | 7.4 | 38 | 1.51 | 63 | 17 | 0.49 to 0.51 |
| Example 1-3 | 9.6 | 41 | 1.58 | 61 | 12 | 0.49 to 0.51 |
| Comparative Example 1-1 | 11.2 | 36 | 1.51 | 62 | 8 | 0.49 to 0.51 |

TABLE 1-continued

|  | Total concentration of alkali metal ions and alkaline earth metal ions in adhesive layer (ppm) | Maximum birefringence (nm/cm) | Density of adhesive layer (g/cm³) | Thickness of adhesive layer (μm) | Adhesive strength (kgf/cm²) | Height of steps (mm) |
|---|---|---|---|---|---|---|
| Comparative Example 1-2 | 13.4 | — | — | — | — | — |
| Example 2-1 | 5.2 | 65 | 1.52 | 64 | 22 | 0.49 to 0.51 |
| Example 2-2 | 5.4 | 78 | 1.50 | 61 | 24 | 0.49 to 0.51 |
| Example 2-3 | 5.2 | 84 | 1.57 | 60 | 20 | 0.49 to 0.51 |
| Example 2-4 | 5.3 | 106 | 1.52 | 62 | 19 | 0.49 to 0.51 |
| Example 2-5 | 5.3 | 128 | 1.58 | 61 | 19 | 0.49 to 0.51 |
| Example 2-6 | 5.3 | 41 | 1.50 | 63 | 23 | 0.49 to 0.51 |
| Comparative Example 2-1 | 11.3 | 63 | 1.52 | 62 | 5 | 0.49 to 0.51 |
| Comparative Example 2-2 | 11.1 | 80 | 1.54 | 63 | 3 | 0.49 to 0.51 |
| Comparative Example 2-3 | 11.5 | 108 | 1.51 | 62 | 1 | 0.49 to 0.51 |
| Comparative Example 2-4 | — | 140 | — | — | — | 0.49 to 0.51 |
| Example 3-1 | 4.9 | 37 | 1.35 | 62 | 18 | 0.49 to 0.51 |
| Example 3-2 | 5.1 | 41 | 0.88 | 59 | 7 | 0.49 to 0.51 |
| Example 4-1 | 5.1 | 42 | 1.52 | 81 | 14 | 0.49 to 0.51 |
| Example 4-2 | 5.4 | 40 | 1.51 | 134 | 6 | 0.49 to 0.51 |
| Comparative Example 3-1 | — | 21 | — | — | — | 0.3 to 0.8 |
| Comparative Example 3-2 | — | — | — | — | — | — |

TABLE 2

|  | Quartz glass plate damage | Step delamination | Coloring |
|---|---|---|---|
| Example 1-1 | None | None | None |
| Example 1-2 | None | None | None |
| Example 1-3 | None | None | None |
| Comparative Example 1-1 | None | Delaminated | Discolored |
| Comparative Example 1-2 | None | Delaminated | Discolored |
| Example 2-1 | None | None | None |
| Example 2-2 | None | None | None |
| Example 2-3 | None | None | None |
| Example 2-4 | Damaged only in a small part | None | None |
| Example 2-5 | Partly damaged | None | None |
| Example 2-6 | None | None | None |
| Comparative Example 2-1 | None | Delaminated | Discolored |
| Comparative Example 2-2 | None | Delaminated | Discolored |
| Comparative Example 2-3 | Damaged only in a small part | Delaminated | Discolored |
| Comparative Example 2-4 | Damaged | — | — |
| Example 3-1 | None | None | None |
| Example 3-2 | None | Partly delaminated | None |
| Example 4-1 | None | None | None |
| Example 4-2 | None | Partly delaminated | None |
| Comparative Example 3-1 | None | None | None |
| Comparative Example 3-2 | None | Delaminated | Discolored |

In Examples 1-1 to 1-3, where the total concentration of alkali metal ions and alkaline earth metal ions (ppm by mass) in the adhesive layer was 10 ppm by mass or less, there was no damage to the quartz glass, delamination of the steps (quartz glass members), or coloring. In Comparative Examples 1-1 and 1-2, where the total concentration of alkali metal ions and alkaline earth metal ions (ppm by mass) in the adhesive layer was more than 10 ppm by mass, delamination of steps (quartz glass members) and coloring of the adhesive layer occurred.

By comparing Examples 1-1 and 2-1 to 2-5, it is revealed that the quartz glass body of the quartz glass plate preferably has a birefringence of 100 nm/cm or less when irradiated with an ultraviolet ray at a total irradiation energy within the range of more than 0 kJ/cm² and 20000 kJ/cm² or less. In addition, it is revealed from the comparison of Example 1-1 and Example 2-6 that the indicator of the total irradiation energy amount of the ultraviolet ray hardly depends on the wavelength of the ultraviolet ray.

It is revealed from Examples 2-1 to 2-5 and Comparative Examples 2-1 to 2-3 that a quartz glass plate with the total concentration of alkali metal ions and alkaline earth metal ions in the adhesive layer of more than 10 ppm has an adhesive strength of less than 10 kgf/cm², and step delamination occurs.

It is revealed from Example 2-4 and Comparative Example 2-4 that the birefringence of the quartz glass body in the quartz glass plate is smaller with the adhesive used in the present invention, and there is no damage to the quartz glass body.

Furthermore, it is revealed from comparing Examples 1-1, 3-1, and 3-2 that when the density of the adhesive layer of the quartz glass members is 1.0 g/cm³ or more, adhesive strength is higher and preferable.

Furthermore, it is revealed from comparing Examples 1-1, 4-1, and 4-2 that the thickness of the adhesive layer is preferably 100 μm or less.

In Comparative Example 3-1, where the steps were formed by grinding, variation in the height of the steps was large. In addition, in Comparative Example 3-2, delamination of the steps (quartz glass members) and coloring occurred.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A quartz glass plate having
a quartz glass plate body and
a quartz glass member adhered to the quartz glass plate body through an adhesive layer, wherein
the adhesive layer comprises silica,
a sum of concentrations of Li, Na, and K ions, being alkali metal ions and Ca ions, being alkaline earth metal ions contained in the adhesive layer is 10 ppm by mass or less, and
the adhesive layer has a density of 1.0 g/cm³ or more and 2.0 g/cm³ or less.

2. The quartz glass plate according to claim 1, wherein the quartz glass plate body adhered to the quartz glass member through the adhesive layer has a birefringence of 100 nm/cm or less when irradiated with an ultraviolet ray at a total irradiation energy within a range of more than 0 kJ/cm² and 20000 kJ/cm² or less.

3. The quartz glass plate according to claim 1, wherein the adhesive layer has a thickness of 100 μm or less.

4. The quartz glass plate according to claim 2, wherein the adhesive layer has a thickness of 100 μm or less.

5. The quartz glass plate according to claim 1, wherein the adhesive layer has an adhesive strength of 10 kgf/cm² or more when irradiated with an ultraviolet ray at a total irradiation energy within a range of more than 0 kJ/cm² and 20000 kJ/cm² or less.

6. The quartz glass plate according to claim 2, wherein the adhesive layer has an adhesive strength of 10 kgf/cm² or more when irradiated with an ultraviolet ray at a total irradiation energy within a range of more than 0 kJ/cm² and 20000 kJ/cm² or less.

7. The quartz glass plate according to claim 3, wherein the adhesive layer has an adhesive strength of 10 kgf/cm² or more when irradiated with an ultraviolet ray at a total irradiation energy within a range of more than 0 kJ/cm² and 20000 kJ/cm² or less.

8. The quartz glass plate according to claim 4, wherein the adhesive layer has an adhesive strength of 10 kgf/cm² or more when irradiated with an ultraviolet ray at a total irradiation energy within a range of more than 0 kJ/cm² and 20000 kJ/cm² or less.

9. The quartz glass plate according to claim 1, wherein the quartz glass plate is for an ultraviolet ray irradiation window.

10. The quartz glass plate according to claim 2, wherein the quartz glass plate is for an ultraviolet ray irradiation window.

11. The quartz glass plate according to claim 3, wherein the quartz glass plate is for an ultraviolet ray irradiation window.

* * * * *